United States Patent
Golliher et al.

(10) Patent No.: US 6,870,386 B1
(45) Date of Patent: Mar. 22, 2005

(54) METHOD AND APPARATUS FOR MEASURING SHEET RESISTANCE

(75) Inventors: Sean A. Golliher, Windsor, CO (US); Scott C. Savage, Fort Collins, CO (US); John L. McNitt, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/691,938

(22) Filed: Oct. 23, 2003

(51) Int. Cl.$^7$ .............................................. G01R 31/26
(52) U.S. Cl. ..................... 324/765; 324/763; 324/158.1
(58) Field of Search ............................... 324/73.1, 525, 324/537, 549, 705, 763–765, 158.1

(56) References Cited

U.S. PATENT DOCUMENTS 6,509,739 B1 * 1/2003 Voogel et al. .............. 324/525
6,683,465 B2 * 1/2004 Fetterman et al. .......... 324/719

* cited by examiner

Primary Examiner—Minh N. Tang
(74) Attorney, Agent, or Firm—Westman, Champlin & Kelly

(57) ABSTRACT

A resistance measurement circuit includes a plurality of current sources, a plurality of resistor strings and a comparator. Each resistor string is coupled in series with a respective one of the current sources and includes a plurality of nodes with different resistances relative to a reference node. Each node in each resistor string has a different resistance relative to the reference node than corresponding nodes in the other resistor strings. The comparator has a first comparison input coupled to a reference voltage and a second comparison input selectively coupled to the plurality of nodes in each resistor string.

19 Claims, 2 Drawing Sheets

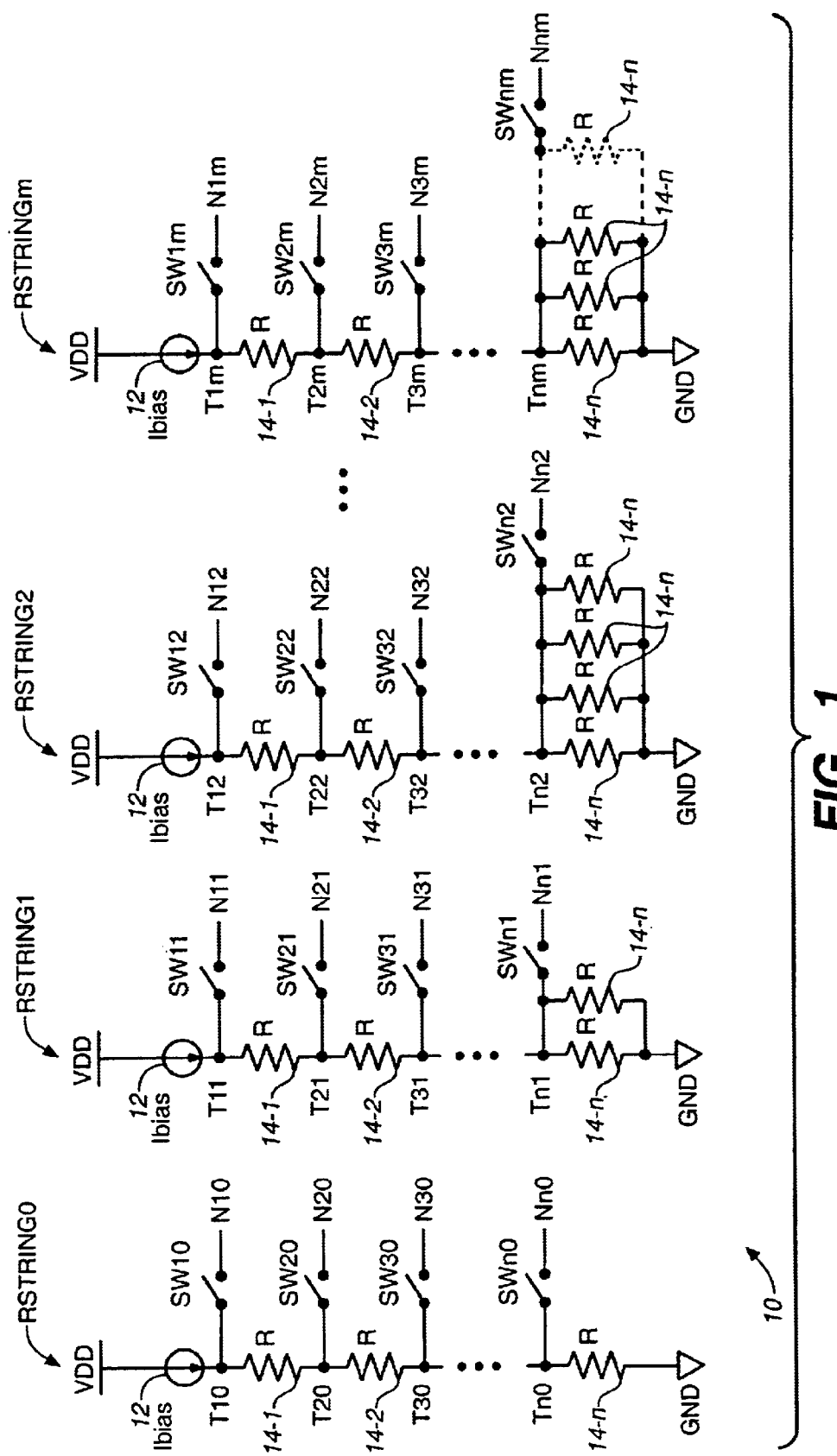
FIG._1

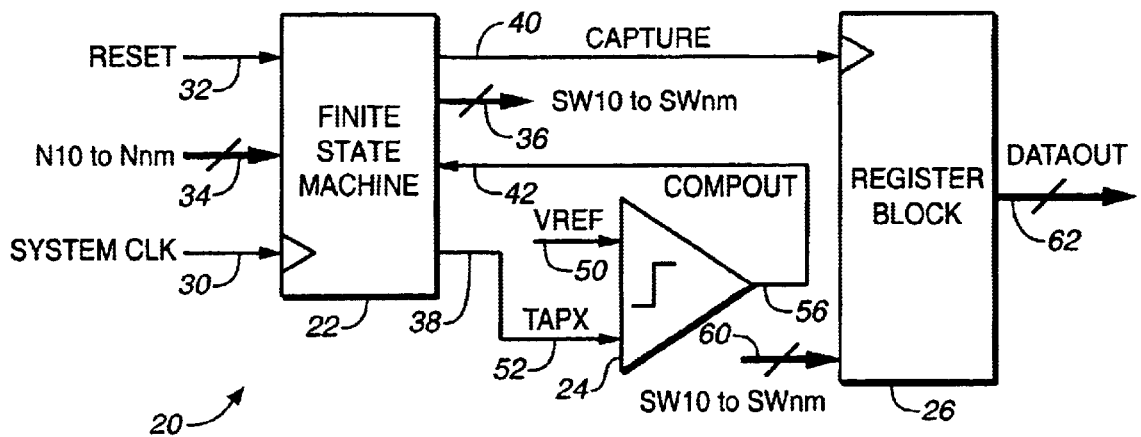
*FIG._2*
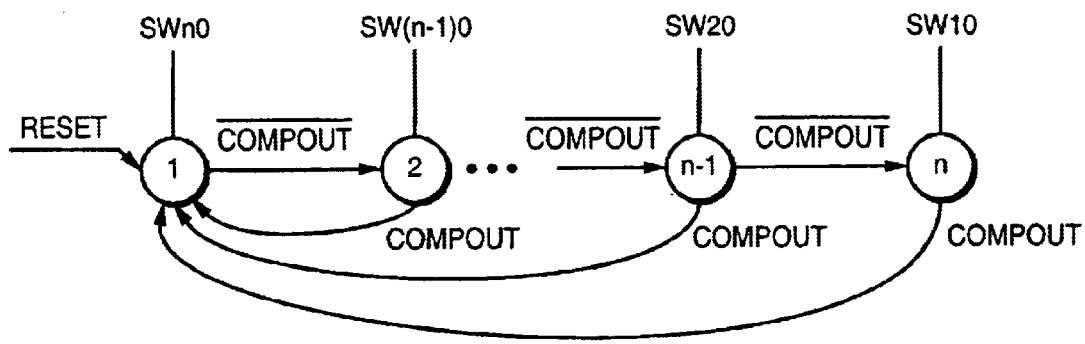
*FIG._3*
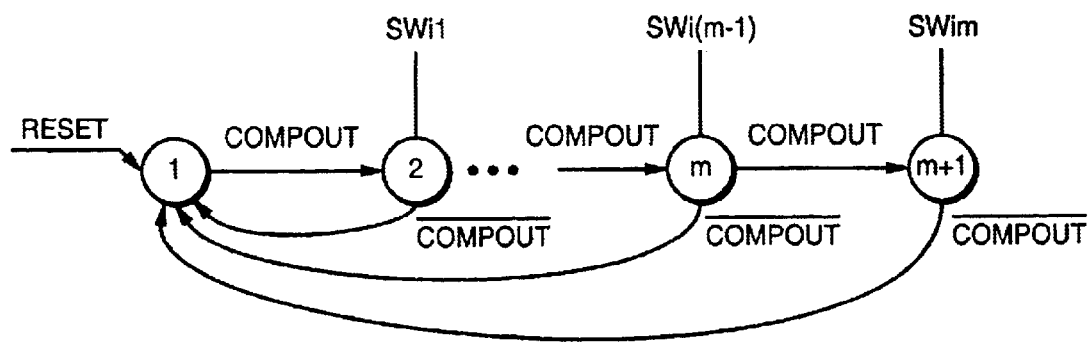
*FIG._4*

METHOD AND APPARATUS FOR MEASURING SHEET RESISTANCE

FIELD OF THE INVENTION

The present invention relates to the measurement of sheet resistance and in particular to a digital method and apparatus for automatic measurement of sheet resistance of a material on an integrated circuit, for example.

BACKGROUND OF THE INVENTION

In the design and fabrication of electrical and electronic components, there is often a need for measuring the sheet resistance of a fabricated material. In the design of a semiconductor integrated circuit, the sheet resistance of materials fabricated on the integrated circuit is often needed for process and device characterization. For example, sheet resistance is commonly used to evaluate the outcome of semiconductor doping operations. The sheet resistance can be needed for any material or device that is fabricated on the integrated circuit.

The following example shows one method of defining sheet resistance. If a rectangular block of uniformly doped material has a resistively p, a length L, and a cross-sectional area A, then the resistance of the rectangular block can be expressed as, $$R = \rho \frac{L}{A} \qquad \text{EQ. 1}$$

If the rectangular block has a width W and thickness t, then the resistance can be rewritten $$R = \frac{\rho}{t} \times \frac{L}{W} = Rs \frac{L}{W} \qquad \text{EQ. 2}$$

where Rs=ρ/t is the sheet resistance in ohms of a layer of the material of the block. However, sheet resistance is often expressed in units of "omhs per square," where L/W is the number of units squares of the material. Therefore, if the sheet resistance of the material is known, the resistance of a particular device formed of that material can be calculated from the number of "squares" of the material in the body of the device.

The typical method of measuring sheet resistance is analog in nature. A known current is inserted into the resistor and the voltages across the resistor are measured so that the sheet resistance for the material can be determined. In the Van der Pauw method, resistively of a semiconductor is measured by using four probes (contacts) located arbitrarily on the surface of the material. Alternate contacts are used to measure two sets of current-voltage characteristics and then a value of the resistively is extracted from a formula.

These analog-type methods are rather slow and complex and often require physical access to the material being tested. Improved methods and apparatus for measuring sheet resistance of a material are therefore desired.

SUMMARY OF THE INVENTION

One embodiment of the present invention is directed to a resistance measurement circuit, which includes a plurality of current sources, a plurality of resistor strings and a comparator. Each resistor string is coupled in series with a respective one of the current sources and includes a plurality of nodes with different resistances relative to a reference node. Each node in each resistor string has a different resistance relative to the reference node than corresponding nodes in the other resistor strings. The comparator has a first comparison input coupled to a reference voltage and a second comparison input selectively coupled to the plurality of nodes in each resistor string.

Another embodiment of the present invention is directed to an integrated circuit test structure. The test structure includes an integrated circuit substrate, a plurality of current sources on the substrate and a plurality of resistor strings on the substrate. Each resistor string is coupled in series with a respective one of the current sources and comprises a plurality of nodes with different resistances relative to a reference node. Each node in each resistor string has a different resistance relative to the reference node than corresponding nodes in the other resistor strings.

Another embodiment of the present invention is directed to a method in which a bias current is passed through a sequence of resistor strings. Each resistor string includes a plurality of nodes with different resistances relative to a reference node. Each node in each resistor string has a progressively different resistance relative to the reference node than corresponding nodes in preceding resistor strings in the sequence. Voltages on successive nodes in a first of the resistor strings are sequentially compared to a reference voltage until a voltage on a selected one of the nodes crosses the reference voltage in a first direction. The voltage on the node corresponding to the selected node in successive ones of the resistor strings in the sequence is compared to the reference voltage until the voltage on a selected one of the resistor strings crosses the reference voltage in a second direction, opposite to the first direction.

BRIEF DESCRIPTION OF THE DRAWINGS

FIG. 1 is a schematic diagram illustrating a resistance test structure in accordance with one embodiment of the present invention.

FIG. 2 is a schematic diagram illustrating a resistance measurement circuit for measuring sheet resistance using the test structure shown in FIG. 1.

FIG. 3 is a state diagram illustrating operation of a first state machine used in the circuit shown in FIG. 2.

FIG. 4 is a state diagram illustrating operation of a second state machine used in the circuit shown in FIG. 2.

DETAILED DESCRIPTION OF ILLUSTRATIVE EMBODIMENTS

FIG. 1 is a schematic diagram illustrating a resistance test structure 10 for measuring sheet resistance of a material in accordance with one embodiment of the present invention. Test structure 10 can be constructed of discreet components or devices that are fabricated on an integrated circuit, for example. In one embodiment, test structure 10 is used for measuring the sheet resistance of N-type and P-type diffusion regions on an integrated circuit. However, test structure 10 can be used to measure the resistance of any other material fabricated on an integrated.

Test structure 10 includes a plurality of resistor strings that are labeled "RSTRING0" to "RSTRINGm", where m is any integer variable. Each resistor string RSTRING0–RSTRINGm is coupled between voltage supply terminals VDD and GND and includes a current source 12 and n resistors 14-1 to 14-n connected in series with one another, where n is any integer variable. Voltage supply terminal GND operates as a reference node. Current source 12 is coupled between supply terminal VDD and the first resistor 14-1. Resistors 14-1 to 14-n are coupled between current source 12 and reference terminal GND.

Current source 12 supplies a predetermined bias Ibias to resistors 14-1 to 14-n The bias current Ibias can be a known off-chip current or an internally generated current from a bandgap circuit reference, for example. Other type of current sources can also be used.

Resistors 14-1 to 14-n are formed of geometrically defined material that is fabricated on the integrated circuit, such as diffusion regions or predefined lengths of conductive segments. All resistors have a substantially identical geometry, with the same length, width and thickness of material that forms the body of the resistor. Therefore, each resistor can be thought of as having a unit resistance R. However, other ratios of resistances and combinations of resistor values can be used in alterative embodiments of the present invention.

Each resistor string has a plurality of voltage taps or nodes with different resistances relative to the reference node at reference terminal GND. For example, RSTRING0 has n taps labeled "T10" to "Tn0", wherein the first digit in the reference numeral indicates the tap number in the resistor string and the second digit represents the string number. Accordingly, any given tap "i" in resistor string "j" can therefore be referred to as Tij, where i=1 to n and j=0 to m.

Each resistor string "RSTRINGj" has a least significant resistor 14-n, which is coupled between a least significant tap Tnj and reference terminal GND. This least significant tap Tnj has the lowest voltage relative to reference terminal GND as compared to the other taps in the string.

Each tap in each resistor string has a different resistance relative to reference terminal GND than their corresponding taps in the other resistors strings. This is accomplished in the embodiment shown in FIG. 1 by coupling a different number of least significant resistors 14-n in parallel with one another between taps Tnj and reference terminal GND in each resistor string.

In the example shown in FIG. 1, each resistor string "RSTRINGj" has $2^j$ resistors 14-n connected in parallel with one another between its least significant tap Tnj and reference terminal GND. Therefore, each tap Tij in each resistor string has a different resistance relative to reference terminal GND than the corresponding taps in the other resistor strings.

If resistor strings RSTRING0–RSTRINGm are considered a sequence of resistor strings, then each set of corresponding taps Tij (where "i" is constant and "j" ranges from 0 to m) have progressively varying resistances within the sequence. For example in the embodiment shown in FIG. 1, each tap in each resistor string has a smaller resistance relative to the reference terminal GND than the corresponding tap in the next preceding resistor string in the sequence and a larger resistance relative than the corresponding tap in the next succeeding resistor string in the sequence. However, the resistances can progressively increase or progressively decrease within the sequence in alternative embodiments. Also, the amount at which the resistances increase or decrease can also vary in alternative embodiments.

With this structure, taps Tij provide a plurality of different voltages that can be compared with a reference voltage for successively approximating the unit resistance R of resistors 14-1 to 14-n. From this resistance, the sheet resistance of the material within each resistor body can be calculated.

The voltage developed on each tap Tij as a result of the bias current Ibias flowing through the resistor string is selectively coupled to a respective node Nij for measurement through a respective switch SWij without adding any switching resistances within the series connection between voltage supply terminals VDD and GND. As described in more detail below, this reduces the measurement error introduced by the test structure.

FIG. 2 is a schematic diagram illustrating an example of a resistance measurement circuit that can be used for measuring sheet resistance using the test structure shown in FIG. 1. Resistance measurement circuit 20 includes a control circuit 22, such as a finite state machine, a comparator 24 and a register block 26. State machine 22 has a system clock input 30 labeled SYSTEM CLK, a reset input 32 labeled RESET, a plurality of node inputs 34 labeled N10 to Nnm, a plurality of switch control outputs 36 labeled SW10 to SWnm, a selected tap output 38 labeled TAPX, a capture control output 40 labeled CAPTURE and a compare result input 42 labeled COMPOUT.

Node inputs 34 are coupled to respective nodes N10 to Nnm, respectively, in test structure 10 (shown in FIG. 1) for receiving the voltages on taps T10 to Tnm when a respective switch SW10 to SWnm is closed. State machine 22 controls the states switches of SW10 to SWnm through switch control outputs 36. Switch control outputs 36 are coupled to respective control terminals of switches SW10 to SWnm. When state machine 22 activates a particular switch control output SWij to close a corresponding switch in test structure 10, state machine 22 couples the corresponding voltage on node Nij to the selected tap output 38 (TAPX). State machine 22 couples only one node Nij to TAPX at one time.

Comparator 24 has a first comparison input 50, a second comparison input 52 and a comparison output 56. First comparison input 50 is coupled to a reference voltage VREF, and second comparison input 52 is coupled to the selected tap output TAPX. Reference voltage VREF is held to a known voltage level, which can be an off-chip voltage or an internally known bandgap circuit voltage, for example.

Comparator 24 generates comparison output COMPOUT on output 56 as a result of a comparison between VREF and TAPX. In one embodiment, COMPOUT has a logic low value when the voltage on TAPX is less than the voltage on VREF and has a logic high value when the voltage on TAPX is higher than the voltage on VREF. Comparison output 56 is coupled to compare result input 42 of state machine 22 such that state machine 22 can monitor the state of COMPOUT with each comparison of TAPX. In one embodiment, comparator 24 is an auto-zeroed comparator having an effective input-referred offset voltage of zero. However, other types of comparators, compare circuits or compare processors can also be used.

Once a selected tap in test structure 10 has been located that has a voltage, which approximates the voltage on VREF, state machine 22 activates capture control output 40 to clock register block 26. Register block 26 has a plurality of data inputs 60 coupled to respective switch control outputs SW10 to SWnm and a plurality of data outputs 62 labeled DATAOUT. When register block 26 is clocked, the register block latches the states on SW10 to SWnm onto DATAOUT.

State machine 22 is configured to perform a predetermined test sequence. FIGS. 3 and 4 illustrate state diagrams implementing a test sequence according to one embodiment of the present invention. However, other test sequences or processes can be used in alternative embodiments of the present invention. FIG. 3 illustrates the states of a first state machine A, and FIG. 4 illustrates the states of a second state machine B, which together form state machine 22 shown in FIG. 2.

Referring to FIG. 3, state Machine A has n states labeled "1" to "n". State Machine A enters state "1" when reset input 32 is activated to begin a test sequence. Also, comparator 24 is auto-zeroed on reset. The test sequence begins by looking for a tap on the first resistor string, RSTRING0, that has a voltage that is higher than VREF.

After reset, state machine A holds only the control input to switch SWn0 in resistor string RSTRING0 high, thereby connecting the voltage on tap Tn0 to the TAPX input of comparator 24. The voltage on tap Tn0 has a value of Ibias*R. If the voltage on tap Tn0 is less than VREF, then comparator output COMPOUT remains low and state Machine A transits to its next state, state "2".

In state "2", only switch SW(n−1)0 in string RSTRING0 is closed to connect tap T(n−1)0 to TAPX. The voltage on tap T(n−1)0 is given by Ibias*2R, which is compared to the known voltage VREF. If the voltage on tap T(n−1)0 is less than VREF, COMPOUT remains low and state machine transits to the next state and configures the switches in string RSTRING0 such that switch SW(n−2)0 is closed.

As soon as the voltage on one of the taps T10 to Tn0 is connected to TAPX and has a voltage greater than VREF, COMPOUT will go high. When COMPOUT goes high, state Machine A returns from its current state to state "1". At this point, state machine 22 can activate capture control output CAPTURE to register the states of switches SW10 to SWn0 in register block 26. Alternatively, the states of these switches are preserved and registered at the end of the overall test sequence.

State machine B has m+1 states labeled "1" to "m+1", as shown in FIG. 4. When COMPOUT goes high, state machine B transits from state "1" to state "2" to initiate the second phase of the test sequence. In the second phase, state machine B moves from state to state in order to sequentially couple the corresponding tap in each successive one of the resistor strings, RSTRING1 to RSTRINGM, in the sequence to TAPX until COMPOUT transitions from the high state back to the low state.

Assuming COMPOUT changed state in FIG. 3 with the comparison of the voltage on the "ith" tap Ti0 in RSTRING0, then state machine B tests each of the corresponding "ith" taps in strings RSTRING1 to RSTRINGm until COMPOUT goes low. These taps belong to a set of corresponding taps Tij in FIG. 1, wherein "i" is fixed and j ranges from 0 to m.

When state machine B enters state "2", switch SWi1 is closed and the voltage on Ti1 is compared with VREF. The voltage on Ti1 is less than the voltage on corresponding tap Ti0. In the example shown in FIG. 1, the voltage on Ti1 is less than the voltage on Ti0 by Ibias*(½)R. If the voltage on Ti1 is greater than VREF, COMPOUT remains high and state machine B enters state "3". In state "3", the voltage on Ti2 is compared with VREF. The voltage on Ti2 is less than the voltage on Ti0 by Ibias*(¼)R.

This process continues until one of the corresponding taps in RSTRING1 to RSTRINGm is activated such that COMPOUT changes to a low state. Once COMPOUT changes to a low state, state machine B returns to state "1" and activates the capture control output COMPOUT to register the states of switches SW10 to SWnm in register block 26. Alternatively, the states of the switches in a particular resistor string can be latched after the voltages on that string have been tested.

Once the test sequence has completed, the latched values of SW10 to SWnm on DATAOUT can be decoded to estimate the value of R, from which the sheet resistance can be approximated. The decoding can be performed by combinational logic, a look up table or a programmed computer, for example.

In order to calculate the upper and lower bounds of the resistance measurement, the value of R is calculated for the last resistor string in the sequence that caused the comparator output to switch low and the previous resistor string in the sequence that caused the comparator output to switch high. Suppose the comparator output switched high on the "ith" tap Ti0 in RSTRING0 and switched low on tap Tij in the "jth" string RSTRINGj. The upper and low bounds for the resistance are given by solving the following equation for R once for each string (assuming there are no errors in the bias current Ibias or the reference voltage VREF), $$(n-i) \cdot R + \frac{R}{2^j} = \frac{V}{Ibais} \qquad \text{EQ. 3}$$

For example, if there are 3 series resistors in each string (n=3) and if the comparator output switched high on the 2nd tap T20 (i=2) in RSTRING0 (j=0) and switched low on the 2nd tap T23 (i=2) in RSTRING3 (j=3), then the upper bound from EQ. 3 would be 2R and the lower bound would be R+⅛R.

If there are n taps per resistor string and m resistor strings in test structure 10, the resolution of the system is $2^{(n+(m-1))}$.

For a desired resolution of n bits, test structure 10 uses $m*2^{n/2}+2^m$ resistors if we assume that first resistor string will have a resolution $2^{n/2}$. Any combination n and m can be used to trade off the desired number of total resistors versus the total number of resistor string stages.

As mentioned above, the test structure shown in FIG. 1 reduces measurement error associated with the switching of resistors into and out of the circuit. Each string is free of any switching resistance in the series path through the resistors. The switches SWij are connected to taps in the resistor strings, in series with the inputs to the comparator, rather than in series with the resistors. By using multiple resistor strings as shown in FIG. 1, the switching resistances can be removed from the measurement. If instead a multiplexing approach were used to switch resistors into and out of a single resistor string, an error would result from adding switching resistance in the series path through the resistors.

The sheet resistance measurement circuit shown in FIGS. 1–4 provides a digital, successive approximation method of automatically measuring sheet resistance of any fabricated material on an integrated circuit. With the use of a system clock, digital logic and a comparator, a digital output word can be stored and decoded to give an approximate value of sheet resistance for the material. This digital method is superior to traditional methods in terms of measurement speed, test complexity package pin and tester pin use.

Although the present invention has been described with reference to preferred embodiments., workers skilled in the art will recognize that changes may be made in form and detail without departing from the spirit and scope of the invention. For example, any suitable control circuit can be used for controlling the test sequence. A finite state machine is provided only as an example. Also, the test sequence can run in any direction. The resistance can be progressively increased along the first string as described above or can be progressively decreased along the first string in an alternative embodiment. Also, successive resistor strings can have successively increasing resistances at corresponding nodes or successively decreasing resistances. Also, the amount and increments at which the resistances are increased or decreased can be modified in alternative embodiments of the present invention.

What is claimed is:

1. A resistance measurement circuit comprising:
   a plurality of current sources;
   a plurality of resistor strings, wherein each resistor string is coupled in series with a respective one of the current sources and comprises a plurality of nodes with different resistances relative to a reference node, and wherein each node in each resistor string has a different resistance relative to the reference node than corresponding nodes in the other resistor strings; and
   a comparator having a first comparison input coupled to a reference voltage and a second comparison input selectively coupled to the plurality of nodes in each resistor string.

2. The resistance measurement circuit of claim 1 wherein:
   the plurality of resistor strings comprises a sequence of the resistor strings; and
   each set of the corresponding nodes in the plurality of resistor strings have progressively varying resistances within the sequence.

3. The resistance measurement circuit of claim 2 wherein:
   each node in each resistor string has a smaller resistance relative to the reference node than the corresponding node in the next preceding resistor string in the sequence and a larger resistance relative to the reference node than the corresponding node in the next succeeding resistor string in the sequence.

4. The resistance measurement circuit of claim 2 wherein:
   each resistor string comprises a plurality of resistors coupled in series with one another; and
   each resistor string further comprises a least significant one of the resistors, which is coupled to the reference node, and a different number of parallel resistors coupled in parallel with the least significant resistor than are coupled in parallel with the least significant resistors in the other resistor strings.

5. The resistance measurement circuit of claim 2 wherein:
   the plurality of resistor strings comprises m+1 resistor strings, which can be indexed in the sequence by a variable i, for i=0 to m+1, where m is an integer variable;
   each resistor string i comprises a plurality of resistors coupled in series with one another, including at least one least significant resistor that is connected to the reference node;
   wherein the at least one least significant resistor in resistor string i comprises $2^i$ resistors coupled in parallel with one another.

6. The resistance measurement circuit of claim 5 wherein each resistor in each resistor string has a unit resistance.

7. The resistance measurement circuit of claim 2 wherein each resistor string further comprises:
   a plurality of resistors coupled in series with one another without any switching resistance between the resistors; and
   a respective switch coupled between each node in the resistor string and the second comparison input.

8. The resistance measurement circuit of claim 7 and further comprising:
   a control circuit having a plurality of switch control outputs, wherein each switch control output is coupled to a control terminal of a respective one of the switches in each of the resistor strings and has an input coupled to a comparison output of the comparator.

9. The resistance measurement circuit of claim 8 wherein the control circuit comprises a finite state machine.

10. The resistance measurement circuit of claim 8 and further comprising:
    a register block having a plurality of data inputs coupled to the plurality of switch control outputs and a latch control input, which is controlled by the control circuit.

11. The resistance measurement circuit of claim 2 and further comprising a control circuit, which is adapted to wherein the control circuit is adapted to:
    sequentially couple successive nodes in a first of the resistor strings in the sequence to the second comparison input until a voltage on a selected one of the nodes in the resistor string causes a comparison output of the comparator to change state; and
    sequentially couple the node corresponding to the selected node in each successive one of the resistor strings in the sequence to the second comparison input until the comparison output again changes state.

12. An integrated circuit test structure comprising:
    an integrated circuit substrate;
    a plurality of current sources on the substrate; and
    a plurality of resistor strings on the substrate, wherein each resistor string is coupled in series with a respective one of the current sources and comprises a plurality of nodes with different resistances relative to a reference node, and wherein each node in each resistor string has a different resistance relative to the reference node than corresponding nodes in the other resistor strings.

13. The integrated circuit test structure of claim 12 wherein:
    the plurality of resistor strings comprises a sequence of the resistor strings; and
    each set of the corresponding nodes in the plurality of resistor strings have progressively varying resistances within the sequence.

14. The resistance measurement circuit of claim 13 wherein:
    each node in each resistor string has a smaller resistance relative to the reference node than the corresponding node in the next preceding resistor string in the sequence and a larger resistance relative to the reference node than the corresponding node in the next succeeding resistor string in the sequence.

15. The resistance measurement circuit of claim 13 wherein:
    each resistor string comprises a plurality of resistors coupled in series with one another; and
    each resistor string further comprises a least significant one of the resistors, which is coupled to the reference node, and a different number of parallel resistors coupled in parallel with the least significant resistor than are coupled in parallel with the least significant resistors in the other resistor strings.

16. The resistance measurement circuit of claim 13 wherein:
    the plurality of resistor strings comprises m+1 resistor strings, which can be indexed in the sequence by a variable i, for i=0 to m+1, where m is an integer variable;
    each resistor string i comprises a plurality of resistors coupled in series with one another, including at least one least significant resistor that is connected to the reference node;

wherein the at least one least significant resistor in resistor string i comprises $2^i$ resistors coupled in parallel with one another.

17. The resistance measurement circuit of claim 16 wherein each resistor in each resistor string has a unit resistance.

18. The resistance measurement circuit of claim 13 wherein each resistor string further comprises:
- a plurality of resistors coupled in series with one another without any switching resistance between the resistors; and
- a respective switch coupled between each node in the resistor string and the second comparison input.

19. A method comprising:
(a) passing a bias current through a sequence of resistor strings, wherein each resistor string comprises a plurality of nodes with different resistances relative to a reference node, and wherein each node in each resistor string has a progressively different resistance relative to the reference node than corresponding nodes in preceding resistor strings in the sequence;
(b) sequentially comparing voltages on successive nodes in a first of the resistor strings to a reference voltage until a voltage on a selected one of the nodes crosses the reference voltage in a first direction; and
(c) after (b), comparing the voltage on the node corresponding to the selected node in successive ones of the resistor strings in the sequence to the reference voltage until the voltage on a selected one of the resistor strings crosses the reference voltage in a second direction, opposite to the first direction.

* * * * *